US012256523B2

(12) United States Patent
Takamizawa et al.

(10) Patent No.: US 12,256,523 B2
(45) Date of Patent: Mar. 18, 2025

(54) BOARD UNIT

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventors: Shun Takamizawa, Yokkaichi (JP); Shigeki Yamane, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

( * ) Notice: Subject to any disclaimer, the term of this patent is extended or adjusted under 35 U.S.C. 154(b) by 200 days.

(21) Appl. No.: 18/246,195

(22) PCT Filed: Jul. 30, 2021

(86) PCT No.: PCT/JP2021/028309
§ 371 (c)(1),
(2) Date: Mar. 22, 2023

(87) PCT Pub. No.: WO2022/064842
PCT Pub. Date: Mar. 31, 2022

(65) Prior Publication Data
US 2023/0354555 A1    Nov. 2, 2023

(30) Foreign Application Priority Data

Sep. 24, 2020   (JP) ................. 2020-159655

(51) Int. Cl.
*H05K 7/20*   (2006.01)
*H05K 1/14*   (2006.01)
*H05K 1/18*   (2006.01)

(52) U.S. Cl.
CPC ........... *H05K 7/2039* (2013.01); *H05K 1/144* (2013.01); *H05K 1/181* (2013.01); *H05K 2201/042* (2013.01)

(58) Field of Classification Search
CPC .... H05K 1/144; H05K 1/0203; H05K 1/0206; H05K 7/20509; H05K 7/2039;
(Continued)

(56) References Cited

U.S. PATENT DOCUMENTS 5,986,887 A * 11/1999 Smith ................. H05K 7/20509
                                                  174/16.3
6,154,367 A * 11/2000 Pavlovic ............ H05K 7/20509
                                                    361/720
(Continued)

FOREIGN PATENT DOCUMENTS

JP    2002-271058 A    9/2002
JP    2011-009522 A    1/2011

OTHER PUBLICATIONS

Lexuan et al., Electrical And Electronic Circuits E.g. Power Circuit, Containing Case, Has Heat Shield Selectively Received Between Power And Control Circuits, And Closing Unit Formed Of Cover And Resin Layer And Selectively Received Between Circuits, dEC. 2, 2005, PE2E translate (Year: 2005).*

(Continued)

*Primary Examiner* — Michael A Matey
(74) *Attorney, Agent, or Firm* — Honigman LLP

(57) ABSTRACT

A board unit includes: a board stack including a first circuit board and a second circuit board that are supported while being spaced apart from each other; an electronic component mounted on the first circuit board; a first heat dissipation member that covers the board stack from outside of the first circuit board; a second heat dissipation member that covers the board stack from outside of the second circuit board; a first heat transfer portion that thermally connects the elec- (Continued)

tronic component and the first heat transfer portion; and a second heat transfer portion that thermally connects the electronic component and the second circuit board. The electronic component has a body located between the first circuit board and the second circuit board, and the second heat transfer portion is partially provided at a position that corresponds to the body of the electronic component.

9 Claims, 4 Drawing Sheets

(58) Field of Classification Search
CPC .............. H05K 7/205; H05K 2201/042; H05K 2201/066; H05K 1/0204; H05K 1/181; H05K 1/145; H05K 2201/2018; H05K 3/284; H05K 1/14; H05K 2201/10598; H05K 2203/1572; H05K 7/20; H05K 7/20409; H05K 9/0037; H05K 1/0201; H05K 1/0212; H05K 2201/041; H05K 2201/043; H05K 2201/10371; H05K 2201/10545; H05K 5/0217; H05K 7/14; H05K 7/1427; H05K 7/209; H05K 9/0024; H05K 9/0032; H05K 9/0033; H01L 2924/181; G06F 1/20
See application file for complete search history.

(56) References Cited

U.S. PATENT DOCUMENTS

| | | | |
|---|---|---|---|
| 2002/0158333 A1* | 10/2002 | Teshima | H01L 21/565 |
| | | | 257/E23.092 |
| 2008/0130234 A1* | 6/2008 | Maehara | H05K 7/205 |
| | | | 361/704 |
| 2009/0086454 A1* | 4/2009 | Sakamoto | H05K 5/065 |
| | | | 361/796 |
| 2011/0037166 A1 | 2/2011 | Ikeda et al. | |
| 2016/0270261 A1* | 9/2016 | Matsuda | G11B 33/1406 |
| 2017/0325328 A1* | 11/2017 | Isaac | H01L 23/3135 |
| 2020/0375017 A1* | 11/2020 | Suematsu | H05K 1/0203 |
| 2022/0293487 A1* | 9/2022 | Teranishi | H05K 7/20409 |
| 2023/0300985 A1* | 9/2023 | Sun | H01L 23/552 |
| | | | 439/65 |
| 2024/0155783 A1* | 5/2024 | Ginjupalli | H05K 5/0217 |

OTHER PUBLICATIONS

International Search Report, Application No. PCT/JP2021/028309, mailed Oct. 26, 2021. ISA/Japan Patent Office.

* cited by examiner

BOARD UNIT

CROSS-REFERENCE TO RELATED APPLICATIONS

This application is the U.S. national stage of PCT/JP2021/028309 filed on Jul. 30, 2021, which claims priority of Japanese Patent Application No. JP 2020-159655, filed on Sep. 24, 2020, the contents of which are incorporated herein.

TECHNICAL FIELD

The present disclosure relates to a board unit.

BACKGROUND

JP2011-9522A discloses a technique for enhancing the heat dissipation of heat generation components mounted on a first circuit board and a second circuit board that are spaced apart from each other and stacked on each other. In an electronic unit disclosed in JP2011-9522A, a heatsink is provided on the outer side of a soldered surface of the first circuit board, and heat of the heat generation components mounted on the first circuit board is transferred to the heatsink. A metal case is provided on the outer side of a component surface of the second circuit board, and heat of the heat generation components mounted on the second circuit board is transferred to the metal case. A heat dissipation sheet, a heat diffusion panel, and a heat dissipation spacer are provided between a component surface of the first circuit board and a soldered surface of the second circuit board, which face each other, and heat of the heat generation component mounted on the second circuit board is transferred to the heatsink via the heat dissipation sheet, the heat diffusion panel, and the heat dissipation spacer.

In the technique disclosed in JP2011-9522A, the heat dissipation sheet and the heat diffusion panel are in contact with the entire soldered surface of the second circuit board, thus causing the risk that the land design of the board may be significantly restricted in view of insulation.

Therefore, it is an object of the present disclosure to provide a technique for enhancing the heat dissipation of an electronic component mounted on a circuit board, while suppressing the land design of the board from being restricted.

SUMMARY

According to the present disclosure, a board unit includes: a board stack including a first circuit board and a second circuit board that are supported while being spaced apart from each other; an electronic component mounted on the first circuit board; a first heat dissipation member that covers the board stack from outside of the first circuit board; a second heat dissipation member that covers the board stack from outside of the second circuit board; a first heat transfer portion that thermally connects the electronic component and the first heat transfer portion; and a second heat transfer portion that thermally connects the electronic component and the second circuit board, wherein the electronic component has a body located between the first circuit board and the second circuit board, and the second heat transfer portion is partially provided at a position that corresponds to the body of the electronic component.

Advantageous Effects

According to the present disclosure, it is possible to enhance the heat dissipation of an electronic component mounted on a circuit board, while suppressing the land design of the board from being restricted.

DETAILED DESCRIPTION OF PREFERRED EMBODIMENTS

Figure 1:
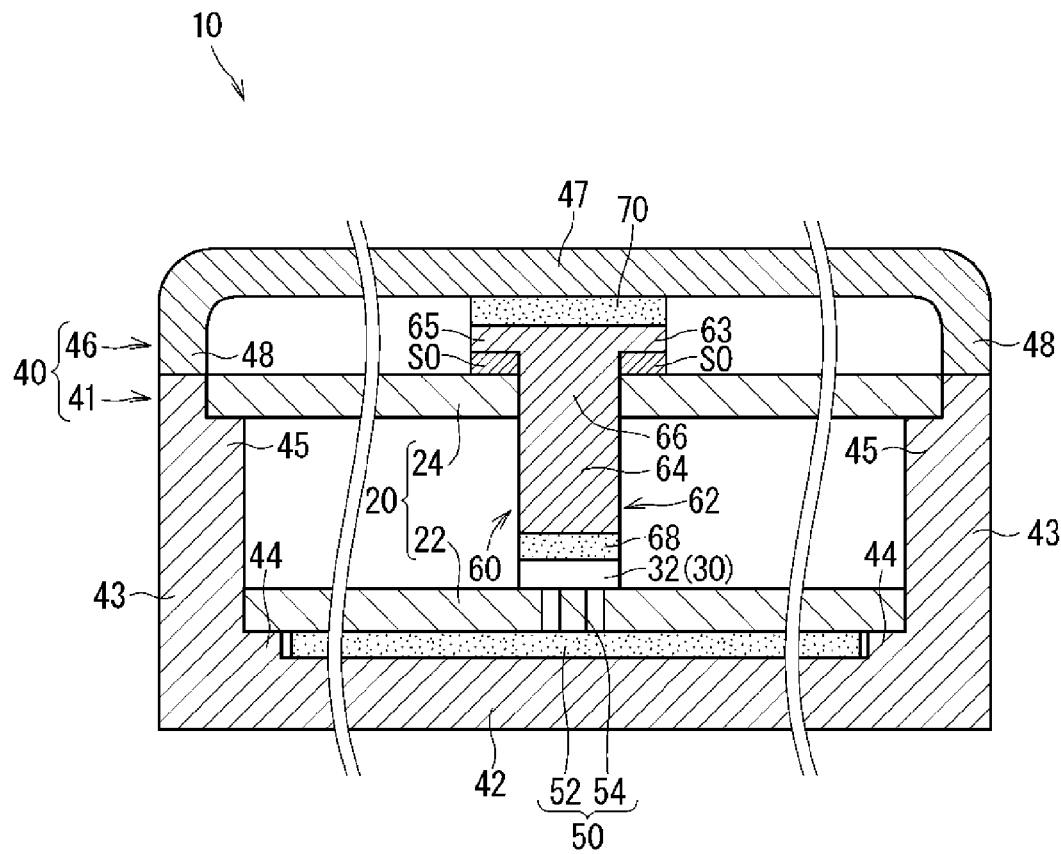
FIG. 1 is a schematic cross-sectional view of a board unit according to Embodiment 1.

First, embodiments of the present disclosure will be listed and described.

The board unit according to the present disclosure is as follows.

First Aspect

In accordance with a first aspect, a board unit includes: a board stack including a first circuit board and a second circuit board that are supported while being spaced apart from each other; an electronic component mounted on the first circuit board; a first heat dissipation member that covers the board stack from outside of the first circuit board; a second heat dissipation member that covers the board stack from outside of the second circuit board; a first heat transfer portion that thermally connects the electronic component and the first heat transfer portion; and a second heat transfer portion that thermally connects the electronic component and the second circuit board, wherein the electronic component has a body located between the first circuit board and the second circuit board, and the second heat transfer portion is partially provided at a position that corresponds to the body of the electronic component. As a result of the electronic component being thermally connected to the first heat dissipation member and the second circuit board by the first heat transfer portion and the second heat transfer portion, the heat dissipation of the electronic component is enhanced. Since the second heat transfer portion is partially provided at a position corresponding to the body of the electronic component, it is possible to prevent such a situation that the land design of the circuit boards is restricted due to the provision of the second heat transfer portion.

Second Aspect

In a second aspect, in the board unit according to the first aspect, the second heat transfer portion may thermally connect the electronic component and the second heat dissipation member. As a result of the electronic component being thermally connected to the second heat dissipation member by the second heat transfer portion, the heat dissipation of the electronic component is further enhanced.

Third Aspect

In a third aspect, in the board unit according to the first or the second aspect, the second heat transfer portion may include a metal member, and the metal member may include a fixed portion fixed to the second circuit board, and a first protruding portion that protrudes from the second circuit board toward the body. With this, the heat conductivity of the second heat transfer portion is enhanced. Also, the metal member being fixed to the second circuit board enables reflow processing on the second circuit board.

Fourth Aspect

In a fourth aspect, in the board unit according to the third aspect, the metal member may include a second protruding portion that protrudes from the second circuit board toward the second heat dissipation member, and a coupling portion that couples the first protruding portion and the second protruding portion, and is received in a hole formed in the second circuit board. With this, the metal member can extend to a position close to the second heat dissipation member, and the heat conductivity of the second heat transfer portion is further enhanced.

Fifth Aspect

In a fifth aspect, in the board unit according to the fourth aspect, a horizontal cross-sectional area of the second protruding portion may be greater than a horizontal cross-sectional area of the coupling portion. Accordingly, the area of the surfaces of the metal member and the second heat dissipation member that face with each other is increased, and thus the heat conductivities of the metal member and the second heat dissipation member are enhanced.

Sixth Aspect

In a sixth aspect, in the board unit according to the fourth aspect, a horizontal cross-sectional area of the first protruding portion may be greater than a horizontal cross-sectional area of the coupling portion. This enables reflow processing on the side of the second circuit board that faces the first circuit board.

Seventh Aspect

In a seventh aspect, in the board unit according to the fourth aspect, a horizontal cross-sectional area of the second protruding portion and a horizontal cross-sectional area of the coupling portion may be smaller than a horizontal cross-sectional area at a leading end of the first protruding portion. With this, a reduction in a mountable area of the second circuit board is suppressed.

Eighth Aspect

In an eighth aspect, in the board unit according to the disclosure, the second heat transfer portion may include a flexible heat transfer member, the flexible heat transfer member being interposed between the first protruding portion and the body, being more flexible than the metal member, and filling up a gap between the first protruding portion and the body. With this, the heat conductivity between the electronic component and the metal member is enhanced.

Ninth Aspect

In a ninth aspect, in the board unit according to the disclosure, a region of the first circuit board covered by the first heat transfer portion may be greater than a region of the first circuit board covered by the second heat transfer portion. With this, the heat conductivity between the first circuit board and the first heat dissipation member is enhanced.

The following will describe specific examples of the board unit of the present disclosure with reference to the drawings. Note that the present disclosure is not limited to the examples but is defined by the claims, and all modifications within the meaning and scope equivalent to the claims are intended to be included.

Embodiment 1

The following will describe a board unit according to Embodiment 1. FIG. 1 is a schematic cross-sectional view of a board unit 10 according to Embodiment 1.

The board unit 10 includes a board stack 20, an electronic component 30, a first heat dissipation member 42, a second heat dissipation member 47, a first heat transfer portion 50, and a second heat transfer portion 60.

The board stack 20 includes a first circuit board 22 and a second circuit board 24 supported while being spaced apart from each other. Between the first circuit board 22 and the second circuit board 24, there is a space in which components mounted on these first circuit board 22 and second circuit board 24 can be accommodated. The circuit boards 22 and 24 may each be a rigid board. The circuit boards 22 and 24 may have a wiring pattern on only one side or on both sides. The circuit boards 22 and 24 may each be a multi-layer board, but the board stack 20 is not a multi-layer board itself.

The electronic component 30 is mounted on the first circuit board 22. A body 32 of the electronic component 30 is located between the first circuit board 22 and the second circuit board 24. The electronic component 30 is mounted as appropriate according to the usage of the board unit 10, and includes, for example, a switching element such as a FET (Field Effect Transistor), a resistor, a coil, a capacitor, and the like.

Note that in the example shown in FIG. 1, only one electronic component 30 is shown, but the board unit 10 may of course include, in addition to the electronic component 30, electronic components mounted on the first circuit board 22 and the second circuit board 24.

Here, the electronic component 30 is mounted on only one side of the first circuit board 22. Also, the side of the first circuit board 22 on which the electronic component 30 is mounted faces the second circuit board 24, and the side of the first circuit board 22 on which no electronic component 30 is mounted faces the first heat dissipation member 42. Of course, electronic components may also be mounted on both sides of the first circuit board 22. Electronic components may be mounted on only one side of the second circuit board 24, or on both sides thereof. When electronic components are mounted on only one side of the second circuit board 24, the side on which the electronic components are mounted may face the first circuit board 22, or the second heat dissipation member 47.

The first heat dissipation member 42 and the second heat dissipation member 47 cover the board stack 20 from the opposite sides. The first heat dissipation member 42 covers the board stack 20 from outside of the first circuit board 22. The second heat dissipation member 47 covers the board stack 20 from outside of the second circuit board 24. Here, the first heat dissipation member 42 and the second heat dissipation member 47 constitute parts of a housing 40 that houses the board unit 10.

The housing 40 includes a case 41 and a cover 46. For example, the case 41 and the cover 46 are each made of a metal material such as aluminum, an aluminum alloy, iron, or an iron alloy, or are made of a resin material such as a high thermal conductivity resin.

The first circuit board 22 and the second circuit board 24 are housed in the case 41. The case 41 is box-shaped with an open top, and has a bottom wall 42 and a side wall 43. The bottom wall 42 serves as the first heat dissipation member 42. The first circuit board 22 is disposed above the bottom wall 42. The case 41 includes support portions 44 and 45. The support portion 44 supports an outer edge portion of the first circuit board 22. The support portion 45 supports an outer edge portion of the second circuit board 24. As a result of being supported by the corresponding support portions 44 and 45, the first circuit board 22 and the second circuit board 24 are supported while being spaced apart from each other. The support portions 44 and 45 protrude to the housing space from the bottom wall 42 and the side wall 43. For example, the first circuit board 22 and the second circuit board 24 are fixed to the corresponding support portions 44 and 45 by screwing or the like. The first circuit board 22 and the second circuit board 24 may be supported while being spaced apart from each other by a spacer provided separately from the case 41.

The cover 46 covers the case 41. The cover 46 has a top wall 47 and a side wall 48. The top wall 47 serves as the second heat dissipation member 47. When the side wall 43 and the side wall 48 abut against each other, the inside of the housing 40 is closed. Fins or the like may be provided on the outer surfaces of the bottom wall 42 and the top wall 47.

Here, the distance between the first circuit board 22 and the second circuit board 24 is greater than the distance between the first circuit board 22 and the bottom wall 42. The distance between the first circuit board 22 and the second circuit board 24 may also be smaller than or equal to the distance between the first circuit board 22 and the bottom wall 42. Also, here, the distance between the first circuit board 22 and the second circuit board 24 is greater than the distance between the second circuit board 24 and the top wall 47. The distance between the first circuit board 22 and the second circuit board 24 may also be smaller than or equal to the distance between the second circuit board 24 and the top wall 47. Also, here, the distance between the first circuit board 22 and the bottom wall 42 is smaller than the distance between the second circuit board 24 and the top wall 47. The distance between the first circuit board 22 and the bottom wall 42 may also be greater than or equal to the distance between the second circuit board 24 and the top wall 47.

The first heat transfer portion 50 thermally connects the electronic component 30 and the bottom wall 42. In the present disclosure, "thermally connecting" means increasing the heat conductivity between two portions spaced apart from each other relative to the heat conductivity of air. Accordingly, the heat conductivity of the first heat transfer portion 50 is higher than the heat conductivity of air. The first heat transfer portion 50 includes a flexible heat transfer member 52 and a thermal via 54, which is a conductor.

The flexible heat transfer member 52 is interposed between the first circuit board 22 and the bottom wall 42. The flexible heat transfer member 52 fills up the gap between the first circuit board 22 and the bottom wall 42. The flexible heat transfer member 52 is, for example, heat conductive grease (referred to also as heat dissipation grease), a heat conductive sheet (referred to also as a heat dissipation sheet), or the like. The flexible heat transfer member 52 may be made of a silicone-based material, or a non-silicone-based material such as an acrylic resin. The flexible heat transfer member 52 preferably has insulation properties. By being interposed between the first circuit board 22 and the bottom wall 42, the flexible heat transfer member 52 is deformed to the shape that corresponds to the gap between the first circuit board 22 and the bottom wall 42, and is in areal contact with the first circuit board 22 and the bottom wall 42.

A region of the first circuit board 22 that is covered by the flexible heat transfer member 52 of the first heat transfer portion 50 is greater than a region of the first circuit board 22 that is covered by the second heat transfer portion 60. For example, the flexible heat transfer member 52 of the first heat transfer portion 50 may be entirely provided on the first circuit board 22.

The thermal via 54 is formed by providing copper foil, solder, or the like on the inner surface of a through hole formed in the first circuit board 22. The thermal via 54 allows heat to be transferred from one side of the first circuit board 22 to another side. Here, a thermal via 54 is formed in the first circuit board 22 at a position directly below or around the body 32, or at positions directly below and around the body 32. A portion of the first circuit board 22 that is covered by the body 32 serves as a land that is electrically connected to a terminal of the electronic component 30, and the thermal via 54 may be formed partially in the land. In the portion of the first circuit board 22 in which the thermal via 54 is formed, flexible heat transfer members similar to the flexible heat transfer member 52 may also be provided between the first circuit board 22 and the body 32.

The second heat transfer portion 60 thermally connects the electronic component 30 and the top wall 47. The heat conductivity of the second heat transfer portion 60 is higher than the heat conductivity of air. The second heat transfer portion 60 is partially provided at a position corresponding to the body 32 of the electronic component 30. The position corresponding to the body 32 refers to a position on a path connecting the electronic component 30 and the top wall 47 as short as possible. Here, the second heat transfer portion 60 is provided directly above the electronic component 30. Here, the second heat transfer portion 60 includes a metal member 62 and flexible heat transfer members 68 and 70.

The metal member 62 includes a fixed portion 63 and a first protruding portion 64. Here, the metal member 62 further includes a second protruding portion 65 and a coupling portion 66. The metal member 62 is made of copper, a copper alloy, aluminum, an aluminum alloy, or the like. The metal member 62 is a member that is referred to also as a rivet, which is provided separately from solders and wiring patterns of the circuit boards. The metal member 62 has a melting point higher than that of solders. The metal member 62 is thicker than the wiring patterns of the circuit boards. If an electronic component is mounted only on one side of the second circuit board 24, and the metal member 62 is soldered to the second circuit board 24, it will be preferable that the metal member 62 be soldered to a surface of the second circuit board 24 on which the electronic component is mounted.

The fixed portion 63 is a portion fixed to the second circuit board 24. The fixed portion 63 may be fixed via a fixing member. In the example shown in FIG. 1, such a fixing member is solder SO. The fixing member does not need to be solder but may also be screws, an adhesive, or the like. If the metal member 62 is made of aluminum or an aluminum alloy, and the metal member 62 is fixed to the second circuit board 24 by the solder SO, a terminal made of copper or a copper alloy is preferably provided as the fixed portion 63. The fixed portion 63 may also be fixed without using any fixing member. The fixed portion 63 may also be a press-fit structure or an engaging structure with respect to the hole.

The first protruding portion 64 is a portion that protrudes from the second circuit board 24 toward the body 32. The second protruding portion 65 is a portion that protrudes from the second circuit board 24 toward the top wall 47. Here, the protrusion length of the first protruding portion 64 from the second circuit board 24 is greater than the protrusion length of the second protruding portion 65 from the second circuit board 24. The protrusion length of the first protruding portion 64 from the second circuit board 24 may also be smaller than or equal to the protrusion length of the second protruding portion 65 from the second circuit board 24. The coupling portion 66 is a portion that couples the first protruding portion 64 and the second protruding portion 65. The coupling portion 66 is received in a hole formed in the second circuit board 24.

Here, the metal member 62 has a shape that includes a columnar body portion and a flange portion protruding to the outer circumferential side of the body portion. Here, the flange portion is provided at one end of the body portion. The body portion and the flange portion may have any outer shape, such as a circular shape or a square shape, for example. The body portion passes through the second circuit board 24. A portion of the body portion that includes a first end on the side without any flange portion serves as the first protruding portion 64. The flange portion and a portion of the body portion that includes a second end on the side on which the flange portion is provided serve as the second protruding portion 65. An intermediate portion of the body portion that extends along an axial direction thereof serves as the coupling portion 66.

The flange portion is formed so as to be greater than a hole in the second circuit board 24 through which the coupling portion 66 is passed, so that the flange portion and the surface of the second circuit board 24 face each other. Also, the solder SO is provided between the flange portion and the second circuit board 24, and the flange portion and the second circuit board 24 are fixed to each other by the solder SO. Accordingly, in the present example, the fixed portion 63 is provided on the second protruding portion 65. The fixed portion 63 is in contact with the surface of the second circuit board 24 that faces the top wall 47, directly or indirectly by the solder or the like. Accordingly, the metal member 62 is thermally connected to the second circuit board 24 at the fixed portion 63. Also, the coupling portion 66 may be in contact with the inner surface of the hole in the second circuit board 24, directly or indirectly by the solder or the like. The metal member 62 may also be thermally connected to the second circuit board 24 at a position of the coupling portion 66.

The horizontal cross-sectional area of the second protruding portion 65 is greater than the horizontal cross-sectional area of the coupling portion 66. In the present disclosure, "horizontal cross-sectional area" refers to an area of a cross section of an object member taken along a plane orthogonal to a direction (here, the vertical direction of FIG. 1) connecting the bottom wall 42 and the top wall 47. Here, the second protruding portion 65 includes both the body portion and the flange portion, and the coupling portion 66 only includes the body portion, out of the body portion and the flange portion, and as a result, the horizontal cross-sectional area of the second protruding portion 65 is greater than the horizontal cross-sectional area of the coupling portion 66. Similarly, the horizontal cross-sectional area of the second protruding portion 65 is greater than the horizontal cross-sectional area of the first protruding portion 64.

A flexible heat transfer member 68 is interposed between the first protruding portion 64 and the body 32. The flexible heat transfer member 68 fills up the gap between the first protruding portion 64 and the body 32. A flexible heat transfer member 70 is interposed between the second protruding portion 65 and the top wall 47. The flexible heat transfer member 70 fills up the gap between the second protruding portion 65 and the top wall 47. Similar to the flexible heat transfer member 52 of the first heat transfer portion 50, the flexible heat transfer members 68 and 70 are, for example, heat conductive grease, a heat conductive sheet, or the like. The flexible heat transfer members 68 and 70 preferably have insulation properties. By being interposed between the first protruding portion 64 and the body 32, the flexible heat transfer member 68 is deformed to the shape that corresponds to the gap between the first protruding portion 64 and the body 32, and is in areal contact with the first protruding portion 64 and the body 32. By being interposed between the second protruding portion 65 and the top wall 47, the flexible heat transfer member 70 is deformed to the shape that corresponds to the gap between the second protruding portion 65 and the top wall 47, and is in areal contact with the second protruding portion 65 and the top wall 47.

A part of heat generated by the electronic component 30 reaches the bottom wall 42 via the thermal via 54 and the flexible heat transfer member 52. When the flexible heat transfer member 52 and the thermal via 54 of the first heat transfer portion 50 are provided directly below the electronic component 30, a part of heat generated by the electronic component 30 easily reaches the bottom wall 42, thus enhancing the heat dissipation of the electronic component 30.

Another part of the heat generated by the electronic component 30 reaches the second circuit board 24 via the flexible heat transfer member 68 and the metal member 62. Also, another part of the heat generated by the electronic component 30 reaches the top wall 47 via the flexible heat transfer member 68, the metal member 62, and the flexible heat transfer member 70. When the flexible heat transfer member 68 and the metal member 62 of the second heat transfer portion 60, and the flexible heat transfer member 70 are provided directly above the electronic component 30, another part of the heat generated by the electronic component 30 easily reaches the second circuit board 24 and the top wall 47, thus enhancing the heat dissipation of the electronic component 30.

Effects and the Like of Embodiment 1

According to the board unit 10 having the above-described configuration, the electronic component 30 is thermally connected to the bottom wall 42 and the second circuit board 24 by the first heat transfer portion 50 and the second heat transfer portion 60, thereby enhancing the heat dissipation of the electronic component 30. Since the second heat transfer portion 60 is partially provided at a position corresponding to the body 32 of the electronic component 30, it is possible to prevent such a situation that the land design of the circuit boards 22 and 24 is restricted due to the provision of the second heat transfer portion 60. Furthermore, the second heat transfer portion 60 thermally connects the electronic component 30 and the top wall 47. With this, the heat dissipation of the electronic component 30 are further enhanced.

Also, the second heat transfer portion 60 includes the metal member 62, and the metal member 62 includes the fixed portion 63 fixed to the second circuit board 24, and the first protruding portion 64 that protrudes from the second circuit board 24 toward the body 32. The metal member 62 typically has a heat conductivity higher than those of a heat dissipation grease, a heat dissipation sheet, and the like. With this, the heat conductivity of the second heat transfer portion 60 is enhanced. Also, since the metal member 62 is fixed to the second circuit board 24, reflow processing can be easily performed on the second circuit board 24.

Also, a flexible heat transfer member such as a heat dissipation grease or a heat dissipation sheet is, due to its flexibility, likely to come into areal contact with an object, but if the flexible heat transfer member locally has a large thickness, the shape retention properties thereof will be likely to decrease. Therefore, if the distance between the first circuit board 22 and the second circuit board 24 is large, it is difficult to locally provide a flexible heat transfer member such as a heat dissipation grease or a heat dissipation sheet. In contrast, because of high shape retention properties of the metal member 62, even if the distance between the first circuit board 22 and the second circuit board 24 is large, the state in which the metal member 62 is partially provided at a position corresponding to the body 32 will be likely to become stabilized.

Also, the metal member 62 includes the second protruding portion 65 that protrudes from the second circuit board 24 toward the top wall 47, and the coupling portion 66 that couples the first protruding portion 64 and the second protruding portion 65 and is received in a hole formed in the second circuit board 24. With this, the metal member 62 can extend to a position close to the top wall 47, and the heat conductivity of the second heat transfer portion 60 is further enhanced.

Also, the horizontal cross-sectional area of the second protruding portion 65 is greater than the horizontal cross-sectional area of the coupling portion 66. Accordingly, the area of the surfaces of the metal member 62 and the top wall 47 that face with each other is increased, and thus the heat conductivities of the metal member 62 and the top wall 47 are enhanced.

Also, the second heat transfer portion 60 includes the flexible heat transfer member 68 that is interposed between the first protruding portion 64 and the body 32, is more flexible than the metal member 62, and fills up the gap between the first protruding portion 64 and the body 32. With this, the heat conductivity between the electronic component 30 and the metal member 62 is enhanced.

Also, a region of the first circuit board 22 that is covered by the first heat transfer portion 50 is greater than a region of the first circuit board 22 that is covered by the second heat transfer portion 60. With this, the heat conductivity between the first circuit board 22 and the bottom wall 42 is enhanced.

Embodiment 2

Figure 2:
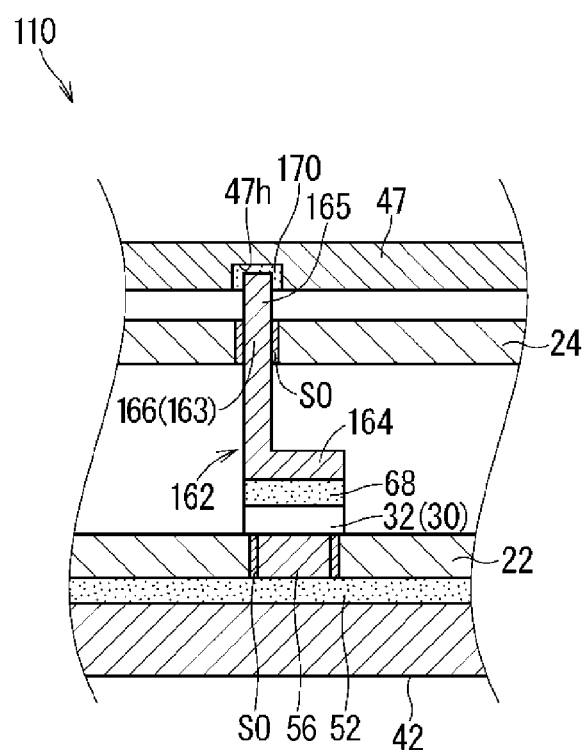
FIG. 2 is a schematic cross-sectional view of a board unit according to Embodiment 2.

The following will describe a board unit according to Embodiment 2. FIG. 2 is a schematic cross-sectional view of a board unit 110 according to Embodiment 2. Note that in descriptions of following embodiments, the same reference numerals are given to the same constituent components as those described above, and descriptions thereof are omitted.

In the board unit 110, the shape of a metal member 162 is different from the shape of the above-described metal member 62. The horizontal cross-sectional area of a second protruding portion 165 of the metal member 162, and the horizontal cross-sectional area of a coupling portion 166 are smaller than the horizontal cross-sectional area at the leading end of a first protruding portion 164. With this, a reduction in a mountable area of the second circuit board 24 is suppressed.

The metal member 162 has, for example, a shape that includes a bottom plate portion and a side plate portion that stands upright from one side of the bottom plate portion. Such a metal member 162 may be obtained by, for example, bending a flat plate-shaped metal plate member at an intermediate portion into an L-shape. The bottom plate portion is disposed so as to face the body 32. Also, the side plate portion extends toward the top wall 47. The side plate portion passes through the second circuit board 24. Here, the bottom plate portion corresponds to the leading end of the first protruding portion 164. Also, an end of the side plate portion on the bottom plate portion side corresponds to a base end of the first protruding portion 164, an end on the opposite side corresponds to the second protruding portion 165, and an intermediate portion corresponds to the coupling portion 166. A hole in the second circuit board 24 through which the side plate portion is passed is a long hole elongated in one side. For example, solder SO or the like is provided between the metal member 162 and the inner surface of the long hole, so that the metal member 162 and the second circuit board 24 are fixed to each other. Accordingly, in the present example, a fixed portion 163 is provided at the coupling portion 166.

A recess 47h is formed in the top wall 47 at a position corresponding to the leading end of the second protruding portion 165. Also, the leading end of the second protruding portion 165 is located in the recess 47h. With this, the area of the surfaces of the second protruding portion 165 and the top wall 47 that face with each other is increased, and the heat dissipation properties are enhanced. In the present example, a flexible heat transfer member 170 located between the metal member 162 and the top wall 47 is provided between the inner surface of the recess 47h and the leading end of the second protruding portion 165.

Also, in the present example, the first heat transfer portion 50 includes a metal member 56, instead of the thermal via 54. A hole is formed in a portion of the first circuit board 22 that is covered by the body 32, and the metal member 56 is received in the hole. In the example shown in FIG. 2, the metal member 56 is smaller than the hole, and is fixed to the first circuit board 22 by the solder SO provided between the inner surface of the hole and the metal member 56. The metal member 56 may also be press fit into the hole. Also, similar to the metal member 62, the metal member 56 may include a body portion and a flange portion. This flange portion may protrude from the first circuit board 22 toward the bottom wall 42. Also, this flange portion may be fixed to the first circuit board 22.

In this example, a part of heat generated by the electronic component 30 reaches the bottom wall 42 via the metal member 56 and the flexible heat transfer member 52. Another part of the heat generated by the electronic component 30 reaches the top wall 47 via the flexible heat transfer member 68, the metal member 162, and the flexible heat transfer member 170.

Embodiment 3

Figure 3:
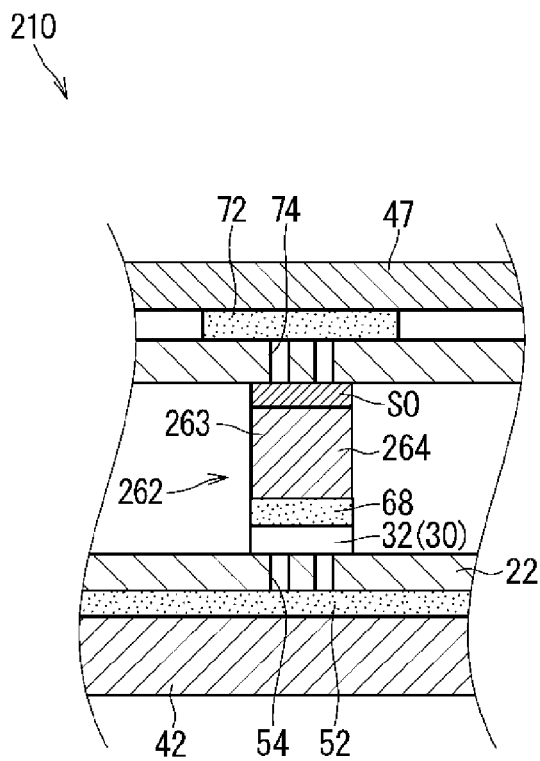
FIG. 3 is a schematic cross-sectional view of a board unit according to Embodiment 3.

The following will describe a board unit according to Embodiment 3. FIG. 3 is a schematic cross-sectional view of a board unit 210 according to Embodiment 3.

In the board unit 210, the shape of a metal member 262 is different from the shape of the above-described metal member 62. The metal member 262 is interposed between the first circuit board 22 and the second circuit board 24. The metal member 262 has a shape obtained by omitting, from the above-described metal member 62, the coupling portion 66 and the second protruding portion 65. With this, in the board unit 210, it is possible to realize a configuration in which the metal member 262 does not pass through the second circuit board 24.

The metal member 262 is shorter than the distance between the first circuit board 22 and the second circuit board 24. The metal member 262 may be columnar such that, for example, the same cross section continues from a first end on the body 32 side to a second end on the second circuit board 24 side. Solder SO or the like is provided between the second end of the metal member 262 and the second circuit board 24, so that the metal member 262 and the second circuit board 24 are fixed to each other. Accordingly, in the present example, a fixed portion 263 is provided at a base end of a first protruding portion 264.

In the present example, instead of the flexible heat transfer member 70, a flexible heat transfer member 72 is interposed between the second circuit board 24 and the top wall 47. Note that thermal via 74 may also be provided in the second circuit board 24 at a position covered by a base end of the first protruding portion 264. In the present example, a part of heat generated by the electronic component reaches the top wall 47 via the flexible heat transfer member 68, the metal member 262, the solder SO, the thermal via 74, and the flexible heat transfer member 72.

Embodiment 4

Figure 4:
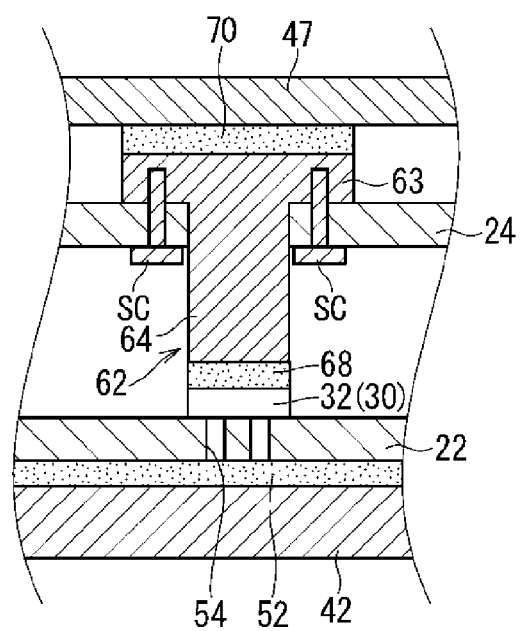
FIG. 4 is a schematic cross-sectional view of a board unit according to Embodiment 4.

The following will describe a board unit according to Embodiment 4. FIG. 4 is a schematic cross-sectional view of a board unit 310 according to Embodiment 4.

In the board unit 310, the fixation structure of the metal member 62 to the second circuit board 24 is different from the fixation structure of the metal member 62 to the second circuit board 24 in the above-described board unit 10. In the board unit 310, the metal member 62 and the second circuit board 24 are screwed and fixed to each other by screws SC.

The present example is the same as the above-described board unit 10 in terms of the shape of the metal member 62, and the positional relationship between the second circuit board 24 and the metal member 62. In the present example, the flange portion of the metal member 62 and the second circuit board 24 have holes through which the screws SC are passed. Using these holes, the screws SC are fastened. Note that when, as in FIG. 4, the heads of the screws SC are located on the outer side of the second circuit board 24, female screws may also be provided in the holes in the flange portion, or nuts may also be provided on the outer side of the flange portion, separately from the flange portion. Also, if the heads of the screws SC are provided on the outer side of the flange portion, nuts are preferably provided on the outer side of the second circuit board 24, separately from the second circuit board 24. In the present example, a part of heat generated by the electronic component 30 reaches the top wall 47 via the flexible heat transfer member 68, the metal member 62, and the flexible heat transfer member 70.

Embodiment 5

Figure 5:
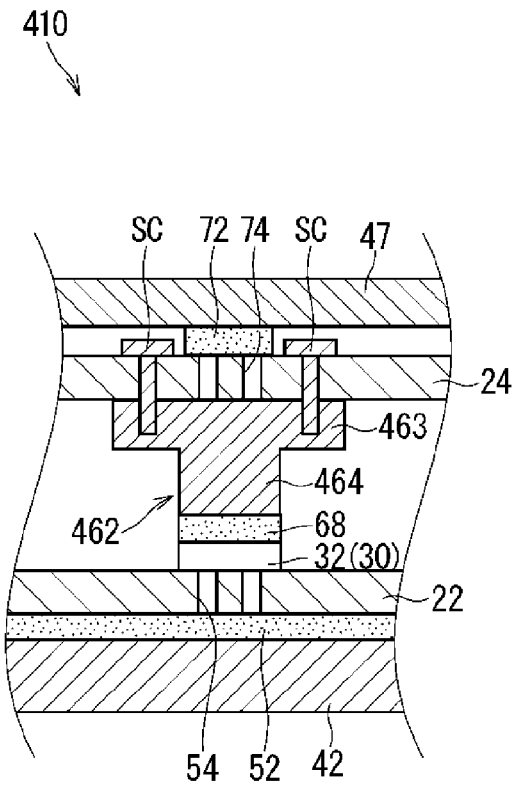
FIG. 5 is a schematic cross-sectional view of a board unit according to Embodiment 5.

The following will describe a board unit according to Embodiment 5. FIG. 5 is a schematic cross-sectional view of a board unit 410 according to Embodiment 5.

In the board unit 410, the shape of a metal member 462 is different from the shape of the above-described metal member 62. Similar to the metal member 62 in the above-described board unit 310, the metal member 462 is screwed and fixed to the second circuit board 24 by screws SC. Similar to the metal member 262 of the board unit 210, the metal member 462 does not pass through the second circuit board 24.

The metal member 462 is shorter than the distance between the first circuit board 22 and the second circuit board 24. Similar to the metal member 62, the metal member 462 has a shape such that it includes a body portion and a flange portion, and the body portion is shorter than the body portion of the metal member 62. The flange portion and the second circuit board 24 have holes through which the screws SC are passed. Using these holes, the screws SC are fastened. A fixed portion 463 is provided at a base end of a first protruding portion 464 of the metal member 462. Note that when, as in FIG. 5, the heads of the screws SC are located on the outer side of the second circuit board 24, female screws may also be provided in the holes in the flange portion, or nuts may also be provided on the outer side of the flange portion, separately from the flange portion. Also, if the heads of the screws SC are provided on the outer side of the flange portion, nuts may be provided on the outer side of the second circuit board 24, separately from the second circuit board 24.

In the present example, a part of heat generated by the electronic component 30 reaches the top wall 47 via the flexible heat transfer member 68, the metal member 462, the thermal via 74, and the flexible heat transfer member 72. A flexible heat transfer member may also be interposed between the metal member 462 and the second circuit board 24.

Embodiment 6

Figure 6:
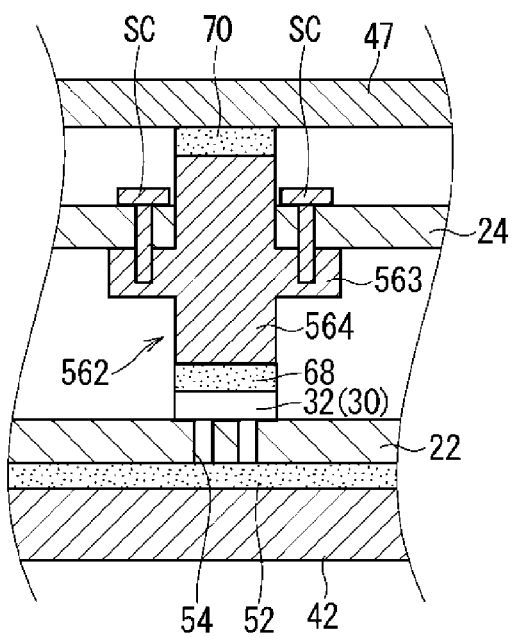
FIG. 6 is a schematic cross-sectional view of a board unit according to Embodiment 6.

The following will describe a board unit according to Embodiment 6. FIG. 6 is a schematic cross-sectional view of a board unit 510 according to Embodiment 6.

In the board unit 510, the shape of a metal member 562 is different from the shape of the above-described metal member 62. Similar to the metal member 62 in the above-described board unit 310, the metal member 562 is screwed and fixed to the second circuit board 24 by screws SC, while passing through the second circuit board 24. The metal member 562 has a flange portion at an intermediate position in the longitudinal direction. The flange portion is provided between the first circuit board 22 and the second circuit board 24. The flange portion and the second circuit board 24 have holes through which the screws are passed. Using these holes, the screws SC are fastened. A fixed portion 563 is provided at a base end of a protruding portion 564 of the metal member 562. Note that when, as in FIG. 6, the heads of the screws SC are located on the outer side of the second circuit board 24, female screws may also be provided in the holes in the flange portion, or nuts may also be provided on the outer side of the flange portion, separately from the flange portion. Also, if the heads of the screws SC are provided on the outer side of the flange portion, nuts may also be provided on the outer side of the second circuit board 24, separately from the second circuit board 24.

In the present example, a part of heat generated by the electronic component 30 reaches the top wall 47 via the flexible heat transfer member 68, the metal member 562, and the flexible heat transfer member 70.

The metal member 562 of the present example may also be fixed to the second circuit board 24 by solder SO, instead of being screwed. In this case, the protruding portion 564 of the metal member 562 serves as a first protruding portion. Also, a portion of the metal member 562 that is received in a hole formed in the second circuit board 24 serves as a coupling portion. Also, a portion of the metal member 562 that protrudes from the second circuit board 24 to the side opposite to the protruding portion 564 serves as a second protruding portion. In this case, the horizontal cross-sectional area of the portion of the metal member 562 in which the flange portion is provided is greater than the horizontal cross-sectional area of the coupling portion. Accordingly, the horizontal cross-sectional area of the first protruding portion is greater than the horizontal cross-sectional area of the coupling portion. This enables reflow processing on the side of the second circuit board 24 that faces the first circuit board 22.

Embodiment 7

Figure 7:
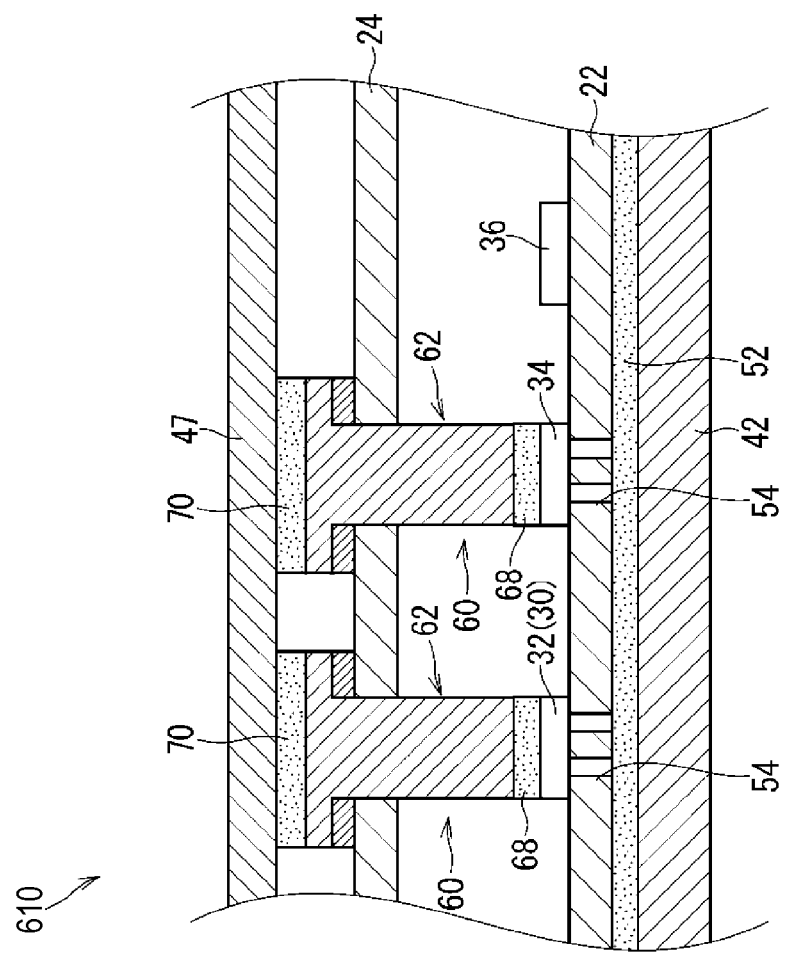
FIG. 7 is a schematic cross-sectional view of a board unit according to Embodiment 7.

The following will describe a board unit according to Embodiment 7. FIG. 7 is a schematic cross-sectional view of a board unit 610 according to Embodiment 7.

In the board unit 610, a plurality of electronic components 30, 34, and 36 are provided on the first circuit board 22. Second heat transfer portions 60 are provided not only at a position corresponding to the electronic component 30 but also at a position corresponding to the electronic component 34. The second heat transfer portion 60 for the electronic component 30 and the second heat transfer portion 60 for the electronic component 34 are provided while being detached from each other. No second heat transfer portion is provided at a position corresponding to the electronic component 36. For example, the electronic component 36 is considered to be an electronic component that generates a smaller amount of heat than the electronic components 30 and 34.

A first heat transfer portion 50 is provided so as to correspond to the plurality of electronic components 30. The first heat transfer portion 50 is provided in a region over the two electronic components 30 and 34 at which the second heat transfer portions 60 are provided. The first heat transfer portion 50 is provided in a region over the two electronic components 34 and 36, namely, the electronic component 34 for which the second heat transfer portion 60 is provided, and the electronic component 36 for which no electronic component is provided.

Modifications

Although the second heat transfer portion has been described so far as thermally connecting the corresponding electronic component 30 and the top wall 47, at a position corresponding to the electronic component 30, this configuration is not essential. The second heat transfer portion does not need to thermally connect, at a position corresponding to the electronic component 30, the electronic component 30 and the top wall 47. For example, in Embodiment 3, a configuration is also possible in which the flexible heat transfer member 72 is omitted, and at a position corresponding to the electronic component 30, the second heat transfer portion does not needs to thermally connect the electronic component 30 and the top wall 47 although the metal member 262 of the second heat transfer portion thermally connects the electronic component 30 and the second circuit board 24.

Although the second heat transfer portion has been described so far as including a metal member, this configuration is not essential. The second heat transfer portion does not need to include a metal member. In this case, the second heat transfer portion may be constituted by a flexible heat transfer member.

Although the second heat transfer portion 60 has been described so far as including the flexible heat transfer member 68, this configuration is not essential. The metal member 62 may directly abut against the body 32.

Also, although a region of the first circuit board 22 that is covered by the first heat transfer portion 50 has been described so far as being greater than a region of the first circuit board 22 that is covered by the second heat transfer portion 60, this configuration is not essential. Also, a region of the first circuit board 22 that is covered by the first heat transfer portion 50 may also be smaller than or equal to a region of the first circuit board 22 that is covered by the second heat transfer portion 60.

Note that the above-described embodiments and modifications can be freely combined unless they contradict each other.

The invention claimed is:

1. A board unit comprising:
a board stack including a first circuit board and a second circuit board that are supported while being spaced apart from each other;
an electronic component mounted on the first circuit board;
a first heat dissipation member that covers the board stack from outside of the first circuit board;
a second heat dissipation member that covers the board stack from outside of the second circuit board;
a first heat transfer portion that thermally connects the electronic component and the first heat dissipation member; and
a second heat transfer portion that thermally connects the electronic component and the second circuit board,
wherein the electronic component has a body located between the first circuit board and the second circuit board,
the second heat transfer portion is partially provided at a position that corresponds to the body of the electronic component,
the second heat transfer portion includes a metal member,
the metal member includes a fixed portion fixed to the second circuit board, and a first protruding portion that protrudes from the second circuit board toward the body, and
the first protruding portion is not fixed to the electronic component.

2. The board unit according to claim 1,
wherein the metal member includes a second protruding portion that protrudes from the second circuit board toward the second heat dissipation member, and a coupling portion that couples the first protruding portion and the second protruding portion, and is received in a hole formed in the second circuit board.

3. The board unit according to claim 2,
wherein a horizontal cross-sectional area of the second protruding portion is greater than a horizontal cross-sectional area of the coupling portion.

4. The board unit according to claim 2,
wherein a horizontal cross-sectional area of the first protruding portion is greater than a horizontal cross-sectional area of the coupling portion.

5. The board unit according to claim 2,
wherein a horizontal cross-sectional area of the second protruding portion, and a horizontal cross-sectional area of the coupling portion are smaller than a horizontal cross-sectional area at a leading end of the first protruding portion.

6. The board unit according to claim 1,
wherein the second heat transfer portion includes a flexible heat transfer member, the flexible heat transfer member being interposed between the first protruding portion and the body, being more flexible than the metal member, and filling up a gap between the first protruding portion and the body.

7. The board unit according to claim 1,
wherein a region of the first circuit board that is covered by the first heat transfer portion is greater than a region of the first circuit board that is covered by the second heat transfer portion.

8. A board unit comprising:
a board stack including a first circuit board and a second circuit board that are supported while being spaced apart from each other;
an electronic component mounted on the first circuit board;
a first heat dissipation member that supports the first circuit board and the second circuit board, while covering the board stack from outside of the first circuit board;
a second heat dissipation member that covers the board stack from outside of and at a distance from the second circuit board in a stack direction;
a first heat transfer portion that thermally connects the electronic component and the first heat dissipation member; and
a second heat transfer portion that thermally connects the electronic component and the second circuit board,
wherein the electronic component has a body located between the first circuit board and the second circuit board, and
the second heat transfer portion is partially provided at a position that corresponds to the body of the electronic component, and thermally connects the electronic component and the second heat dissipation member.

9. The board unit according to claim 8,
wherein the second heat transfer portion includes a metal member, the metal member being provided separately from the first heat dissipation member and the second heat dissipation member, and passing through the second circuit board.

* * * * *